(12) United States Patent
Forstner et al.

(10) Patent No.: US 9,543,997 B2
(45) Date of Patent: Jan. 10, 2017

(54) SYSTEM AND METHOD FOR A MIXER (71) Applicant: Infineon Technologies AG, Neubiberg (DE)

(72) Inventors: Johann Peter Forstner, Steinhoering (DE); Markus Ortner, Linz (AT)

(73) Assignee: Infineon Technologies AG, Neubiberg (DE)

( * ) Notice: Subject to any disclaimer, the term of this patent is extended or adjusted under 35 U.S.C. 154(b) by 137 days.

(21) Appl. No.: 14/160,183

(22) Filed: Jan. 21, 2014

(65) Prior Publication Data
US 2015/0207532 A1  Jul. 23, 2015

(51) Int. Cl.
| | |
|---|---|
| H04B 1/30 | (2006.01) |
| G06G 7/12 | (2006.01) |
| H03D 1/24 | (2006.01) |
| H03D 3/00 | (2006.01) |
| G01S 7/03 | (2006.01) |
| G01S 13/34 | (2006.01) |
| G01S 7/35 | (2006.01) |
| G01S 13/93 | (2006.01) |

(52) U.S. Cl.
CPC .............. *H04B 1/30* (2013.01); *G01S 7/032* (2013.01); *G01S 7/354* (2013.01); *G01S 13/34* (2013.01); *H03D 3/008* (2013.01); *G01S 13/931* (2013.01); *G01S 2007/358* (2013.01); *H04B 2001/305* (2013.01); *H04B 2001/307* (2013.01)

(58) Field of Classification Search
CPC ............. H03F 1/26; H03F 3/193; H03F 3/68; H03F 1/56; H03F 2200/451; H03F 2200/294; H03F 2200/372; H03F 2200/267; H03F 3/45479; H03F 3/45; H04B 1/30; H04B 2001/305; H04B 2001/307; H03H 11/46; H03H 11/481; H03H 11/00; H03H 11/48; H04L 27/1525; H04L 25/062; H04L 25/06; H04L 27/144; H04L 27/152; G06G 7/12; H03D 1/24
See application file for complete search history.

(56) References Cited

U.S. PATENT DOCUMENTS

| | | | | |
|---|---|---|---|---|
| 4,713,563 | A * | 12/1987 | Marshall | H03F 3/45479 327/561 |
| 5,280,290 | A * | 1/1994 | Evans | G01S 13/345 342/128 |
| 6,771,945 | B1 * | 8/2004 | Pickett | H03D 3/008 455/323 |

(Continued)

FOREIGN PATENT DOCUMENTS

EP   2624447 A1   8/2013

OTHER PUBLICATIONS

Hirschmann, D., "Operations-Verstaerker," Franzis workbook, ISBN 3-7723-6252-4, 2010, 6 pgs.

*Primary Examiner* — Pablo Tran
(74) *Attorney, Agent, or Firm* — Slater Matsil, LLP (57) ABSTRACT

In accordance with an embodiment, a circuit includes a mixer having a signal input port, a local oscillator input port and an output port, a lowpass filter circuit having an input coupled to the output port of the mixer and a terminal configured to be connected to a shunt capacitor, and a difference circuit having a first input coupled to the output port of the mixer, and a second input coupled to an output of the lowpass filter. The output of the difference circuit substantially rejects a DC signal component at the output port of the mixer.

20 Claims, 7 Drawing Sheets

(56) References Cited

U.S. PATENT DOCUMENTS

| | | | | |
|---|---|---|---|---|
| 7,039,382 B2* | 5/2006 | Shu | ............... | H03D 7/1441 |
| | | | | 455/285 |
| 7,307,430 B2* | 12/2007 | Tokuno | ............... | G01R 27/02 |
| | | | | 324/610 |
| 7,493,097 B2* | 2/2009 | Ismail | ............... | H03D 7/00 |
| | | | | 455/285 |
| 7,952,408 B2* | 5/2011 | Eisenstadt | ............... | H03F 3/45183 |
| | | | | 327/231 |
| 8,094,836 B2* | 1/2012 | Chen | ............... | H04H 40/81 |
| | | | | 381/1 |
| 8,571,512 B2* | 10/2013 | Rafi | ............... | H03D 7/12 |
| | | | | 455/130 |
| 2003/0157915 A1* | 8/2003 | Atkinson | ............... | B01F 5/246 |
| | | | | 455/306 |
| 2009/0088110 A1* | 4/2009 | Schuur | ............... | H04B 1/30 |
| | | | | 455/209 |
| 2010/0105344 A1* | 4/2010 | Guo | ............... | H03D 7/1441 |
| | | | | 455/209 |
| 2010/0219896 A1 | 9/2010 | Sanduleanu et al. | | |
| 2013/0065546 A1 | 3/2013 | Ruijter et al. | | |
| 2014/0045443 A1* | 2/2014 | Rofougaran | ............... | H04B 1/10 |
| | | | | 455/131 |
| 2015/0035602 A1* | 2/2015 | Mattisson | ............... | H03F 3/211 |
| | | | | 330/291 |

* cited by examiner

PRIOR ART

SYSTEM AND METHOD FOR A MIXER

TECHNICAL FIELD

The present disclosure relates generally to an electronic device, and more particularly to a system and method for a mixer.

BACKGROUND

Homodyne receivers in which a radio frequency (RF) signal is downconverted using a single frequency conversion have become pervasive in many applications due to the reduced complexity of the RF components used to implement such systems. In comparison to a heterodyne receiver that downconverts a RF signal to an intermediate frequency (IF), filters the IF signal, and then performs one or more additional frequency conversions to downconvert the IF signal to baseband, a homodyne receiver may be implemented using a single frequency conversion stage, thereby eliminating one or more mixing and filtering stages and their associated circuitry.

One issue faced by homodyne mixers is self-mixing of the LO signal which may lead to significant DC offset voltages in the downconverted baseband signal. In some cases, the amplitude of these DC offset voltages may exceed the amplitude of the received signal in radio receivers. In such systems, the DC component at the output of the single conversion mixer is removed by using a highpass filtering network that includes a series capacitor used that blocks DC signals.

In systems in which the received baseband signal has appreciable low frequency content, the cutoff frequency of the DC blocking network may be selected to allow the low frequency content to pass. In some cases, the value of series DC blocking capacitor may be a relatively large value and occupy an appreciable amount of silicon and/or circuit board area.

SUMMARY OF THE INVENTION

In accordance with an embodiment, a circuit includes a mixer having a signal input port, a local oscillator input port and an output port, a lowpass filter circuit having an input coupled to the output port of the mixer and a terminal configured to be connected to a shunt capacitor, and a difference circuit having a first input coupled to the output port of the mixer, and a second input coupled to an output of the lowpass filter. The output of the difference circuit substantially rejects a DC signal component at the output port of the mixer.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a DC blocking circuit that may be used in a homodyne receiver. Embodiments of the present invention may also be applied to other systems and applications including other circuits that utilize DC blocking capacitors such as RF communication systems, radar transceivers and integrated circuits that implement RF systems.

In an embodiment of the present invention, a DC blocking circuit is coupled to an output of a single conversion or homodyne receiver. This DC blocking circuit is implemented using a lowpass filter and a subtraction network that subtracts a lowpass filtered version of the output of the homodyne receiver from a non-filtered output of the homodyne receiver to form a highpass or DC blocked output. The lowpass filter may be implemented using a capacitor that is located on a same silicon substrate as the receiver or may be implemented off-chip, for example, on a circuit board. In some embodiments, the output of the homodyne receiver may be implemented without using series DC blocking capacitors in the signal path of the baseband signal.

Some embodiments of the present invention are directed toward the implementation of Microwave Monolithic Integrated Circuits (MMIC) used for industrial and automotive Frequency Modulated Continuous Wave (FMCW) radar applications. FMCW radar systems operate in "Full Duplex Mode", which means that they transmit and receive simultaneously. Such FMCW systems may operate at 24 GHz or 77/79 GHz for automotive applications may have several receive channels, each of which may have two baseband outputs per receiver chain. It should also be understood that embodiments may be directed toward other frequencies besides 24 GHz and 77/79 GHz. In order to reduce the number of circuit present in such radar systems, many implementations use single-conversion or homodyne downconversion mixers instead of heterodyne mixers. Such systems, however, are prone to large DC offsets due to LO leakage into the receiver input. In conventional systems, DC blocking capacitors are inserted in the baseband output of the downconversion mixers. In some conventional FMCW systems, these capacitors may be large when slow FMCW frequency ramps (chirps) are used. For example, a highpass filter having a corner frequency on the order of 100 Hz may necessitate a large DC blocking capacitor of several hundred nanofarads.

Figure 1:
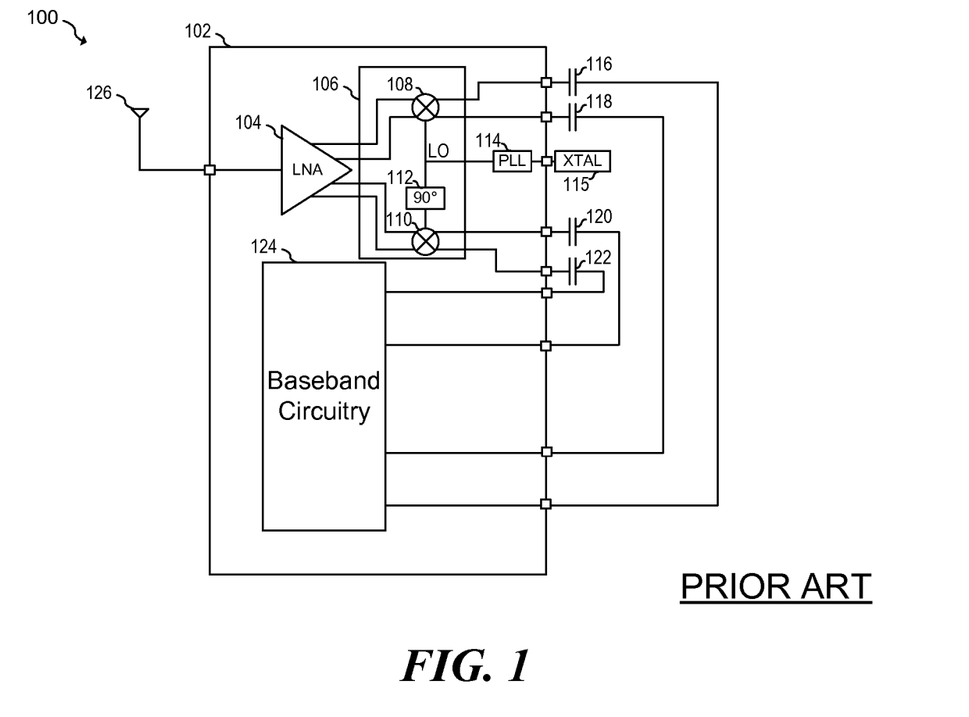
FIG. 1 illustrates a conventional homodyne receiver system.

FIG. 1 illustrates conventional homodyne receiver system 100 that includes antenna 126 coupled to integrated circuit 102. LNA 104 receive, for example, a radar signal from antenna 126 and downconverts the received signal using quadrature mixer 106 that includes I mixer 108, Q mixer 110 and phase shifter 112. External coupling capacitors 116, 118, 120 and 122 are used in order to reduce or block the DC components at the output of quadrature mixer 106. As shown, a total of eight interface pins are used to route the differential outputs of quadrature mixer 106 to capacitors 116, 118, 120 and 112 and back on-chip for coupling to baseband circuitry 124.

Figure 2:
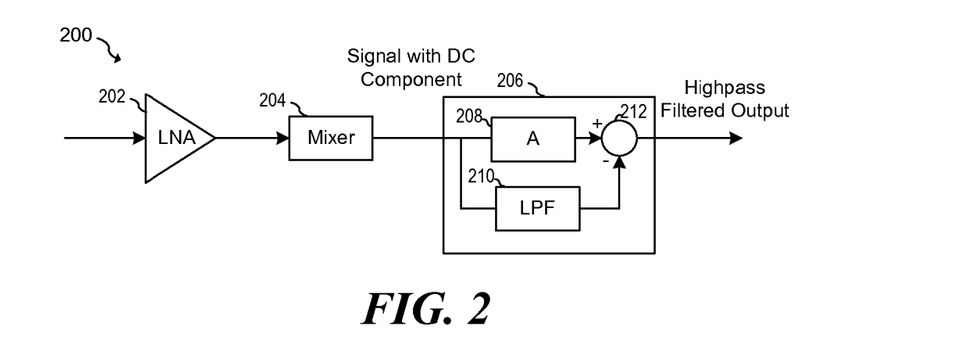
FIG. 2 illustrates an embodiment homodyne receiver system.

FIG. 2 illustrates a block diagram of embodiment homodyne receiver system 200 that includes LNA 202, mixer 204 and embodiment DC blocking circuit 206. In an embodiment, the DC output of mixer 204 is attenuated and/or eliminated by implementing a highpass transfer function using a lowpass filter. As shown, DC blocking circuit 206 produces a highpass response by subtracting the output of lowpass filter 210 from gain block 208 via summing block 212. In some embodiments, lowpass filter 210 may be implemented using a shunt RC filter network that is not coupled in series with the output of mixer 204. By creating a highpass function from a lowpass function, series DC blocking capacitors may be eliminated. In embodiments where the lowpass function is implemented, in part, by using external shunt capacitances, only a single package pin may be allocated for each external capacitor instead of two external pins used for DC blocking capacitors in some embodiments.

Figure 3A:
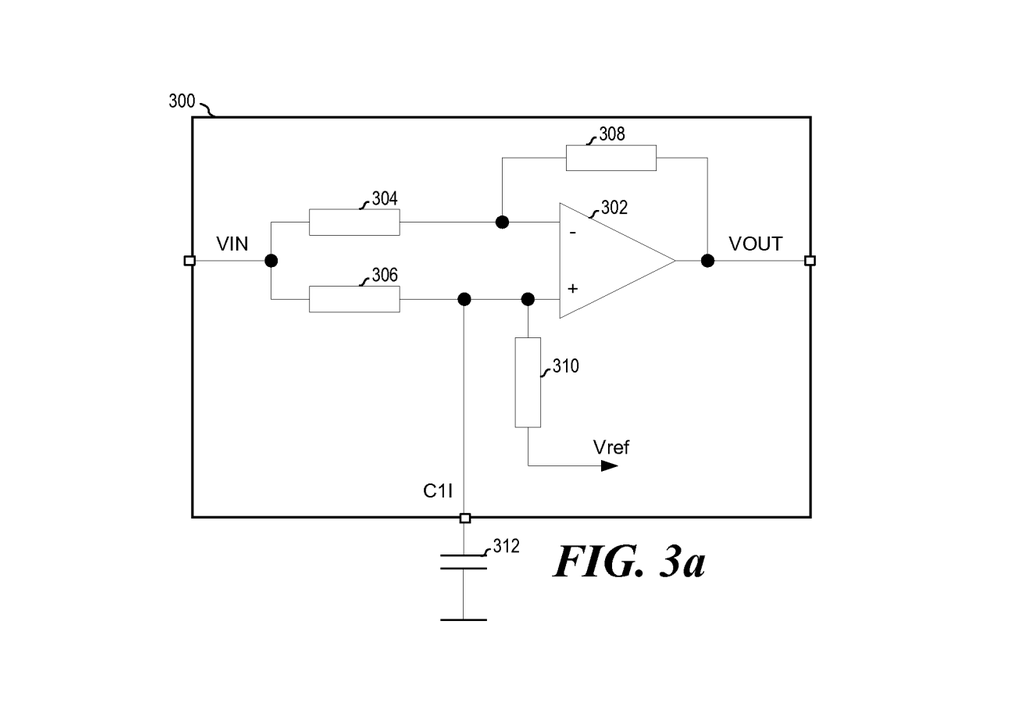
FIGS. 3a-b illustrate embodiment DC blocking circuits.

FIG. 3a illustrates a schematic of circuit 300 that implements an embodiment DC blocking function using operational amplifier (OPAMP) 302. As shown, the inverting path of OPAMP 302 includes feedback resistor 308 and input resistor 304, while the non-inverting path of OPAMP 302 includes a lowpass filter formed by resistors 306 and 310 and capacitor 312. A reference voltage Vref is coupled to the non-inverting input of OPAMP 302 via resistor 310. As shown, DC blocking circuit 300 implements a high-pass or DC blocking having a lower corner frequency that is determined by the RC time constant of resistors 306 and 310 and capacitor 312. In some embodiments, the ratio of resistors 310 and 306 have substantially the same ratio as resistors 308 and 304, which defines the voltage gain of circuit 300. In some embodiments, DC blocking circuit 300 is disposed on an integrated circuit and capacitor 312 is coupled to the non-inverting input of OPAMP 302 via external pin CH. Alternatively, capacitor 312 may be disposed on the same integrated circuit as OPAMP 302 and resistors/304, 306, 308 and 310.

The illustrated operational amplifier circuit configuration has one common input signal VIN that is fed to two inputs of OPAMP 302. Below the cutoff frequency of OPAMP 302, the input signal is amplified with a constant and frequency independent amplification at the inverting input. At the non-inverting input, the input signal is lowpass filtered before it's amplified with the same factor as at the inverting input. Both characteristics sum up at the output. As a result, the signal response has a highpass characteristic due to the lowpass to highpass transformation of the circuit.

Figure 3B:
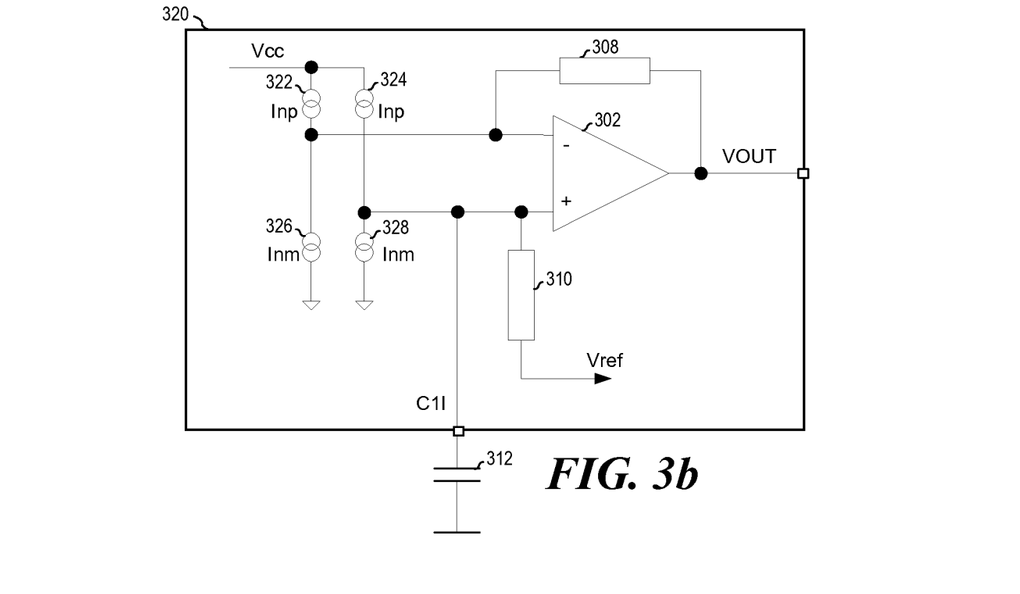

FIG. 3b illustrates a further embodiment circuit 320 that implements a highpass filter response suitable for use with current-mode inputs. Current sources 322 and 324 represent input currents proportional to a positive signal current and current sources 326 and 328 represent input currents proportional to a negative signal current. These current sources 322, 324, 326 and 328 may be representative, for example, of an output of a mixer having a current mode output stage or other circuit that produces a current mode signal. As shown, current sources 322 and 326 and resistor 308 are coupled to the inverting node of OPAMP 302 and form an inverting signal path that produces a voltage inversely proportional to the sum of the input currents from current sources 322 and 326. Current sources 324 and 328 are coupled to the non-inverting input of OPAMP 302 along with capacitor 312 to form a non-inverting lowpass signal path. Thus, voltage VOUT at the output of OPAMP 302 forms a difference between the proportional inverting signal path and the lowpass filtered non-inverting signal path, which is a highpass filter function.

It should be appreciated that the embodiments of FIGS. 3a and 3b are just two examples of many possible filter implementations. In further embodiments, other structures may be used such as alternative filter structures and/or filter structures that utilize higher order lowpass filters to synthesize a higher order highpass response.

Figure 4A:
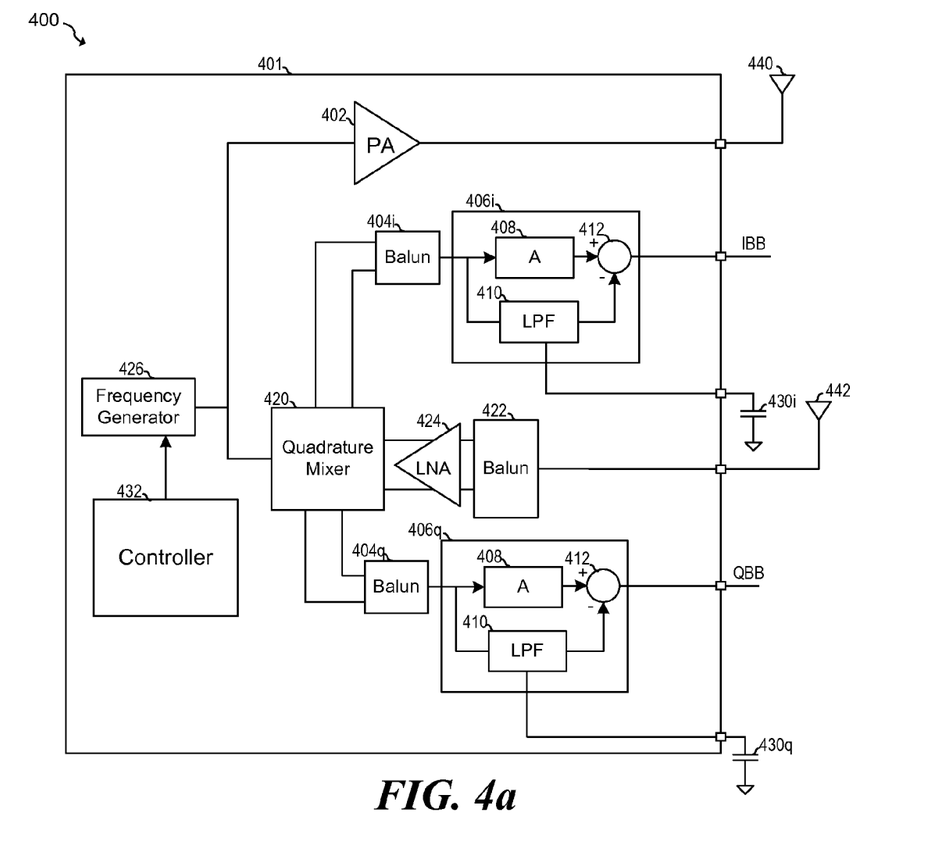
FIGS. 4a-b illustrate embodiment radar systems.

FIG. 4a illustrates an embodiment radar system 400 using that is implemented using embodiment DC blocking circuits. Radar system 400 includes radar transceiver integrated circuit 401 having a transmit path that includes power amplifier 402 coupled to transmit antenna 440 and a receive path that includes quadrature mixer 420 coupled to receive antenna 442 via balun 422 and LNA 424. In the transmit path, frequency generator 426 produces a transmit signal, such as a frequency sweep under control of controller 432. The output of frequency generator 426 is amplified by power amplifier 402 and radiated via transmit antenna 440. Reflections of the transmitted signal are received by receive antenna 442, amplified by LNA 424 and mixed to baseband using quadrature mixer 420. Since the quadrature mixer 420 also receives the output of frequency generator 426, the receive path is synchronized with the transmit path. In an embodiment, DC blocking circuit 406i removes and/or attenuates the DC component at the output of quadrature mixer 420 for the in-phase path and DC blocking circuit 406q removes and/or attenuates the DC component at the output of quadrature mixer 420 for the quadrature path.

Each of DC blocking circuit 406i and DC blocking circuit 406q include an embodiment DC blocking circuit as described above. The functionality of these DC blocking circuits is represented by gain block 408; lowpass filter 410 and summing block 412. However, it should be understood that DC blocking circuit 406i and DC blocking circuit 406q may be implemented using various circuits. For example, in some embodiments, DC blocking circuit 300 illustrated in FIG. 3 may be used. As shown, capacitor 430i is coupled to the lowpass filter circuit of DC blocking circuit 406i and capacitor 430q is coupled to the lowpass filter circuit of DC blocking circuit 406q. Alternatively, capacitors 430i and 430q may be disposed on radar transceiver integrated circuit 401 instead of external to it. In the illustrated embodiment of FIG. 4a, the in-phase baseband signal IBB and quadrature baseband signal QBB are brought to external pins.

In an embodiment, balun 422 converts the single ended output of receive antenna 442 to a differential signal, and baluns 404i and 404q convert the differential outputs of quadrature mixer 420 to single ended signals. It should be appreciated that in alternative embodiments, the partitioning of single-ended signals and differential may be different from what is illustrated in FIG. 4a.

Figure 4B:
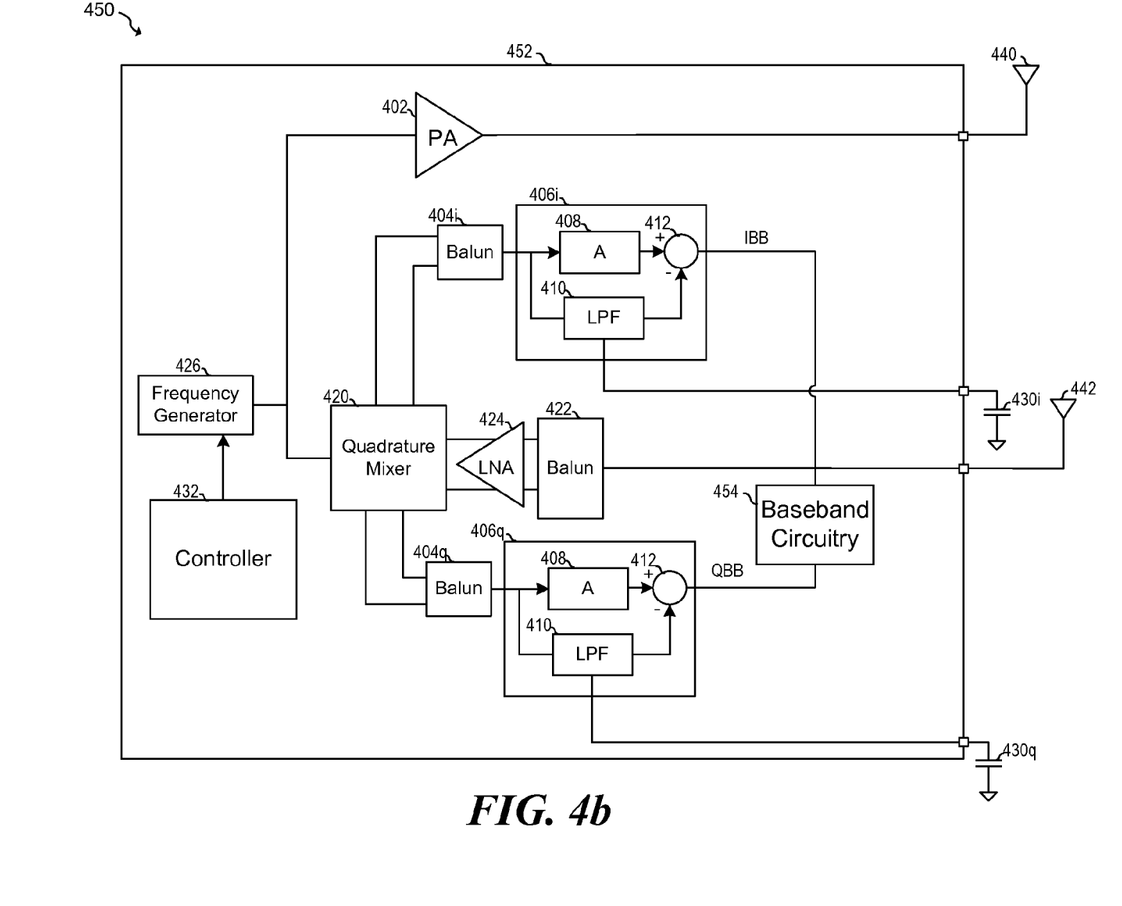

FIG. 4b illustrates an embodiment radar system 450 using radar transceiver integrated circuit 452 in which the in-phase baseband signal IBB and quadrature baseband signal QBB remain on-chip for further processing by baseband circuitry 454. In an embodiment, baseband circuitry 454 may include both analog and digital circuitry used to perform baseband signal recovery/processing or a subset thereof.

Figure 5:
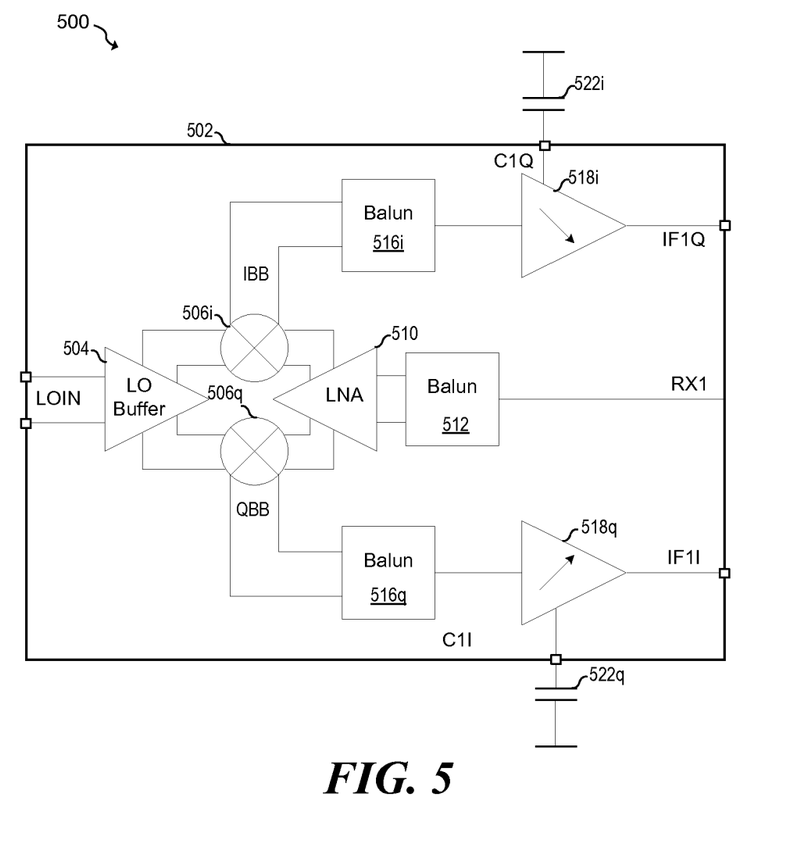
FIG. 5 illustrates an embodiment single IQ receiver system.

FIG. 5 illustrates an embodiment single IQ receiver system 500 that includes LNA 510 coupled to input pin RX1 via balun 512. In-phase mixer 506$i$ and quadrature mixer 506$q$ mix the output of LNA 510 with an LO signal LOIN that is buffered via LO buffer 504 to produce differential baseband signals IBB and QBB. Embodiment DC blocking techniques are implemented in circuits 518$i$ and 518$q$ working in conjunction with capacitors 522$i$ and 522$q$ respectively. Baluns 516$i$ and 516$q$ perform a differential to single-ended conversion as described above. In an embodiment, circuits 518$i$ and 518$q$ may also perform a variable gain function. This may be implemented, for example, by using a variable gain amplifier coupled in series with embodiment DC blocking circuits. In alternative embodiments, the mixer may be implemented by other structures besides a complex (IQ) downconverter. For example, a non-complex mixer may be used.

Figure 6:
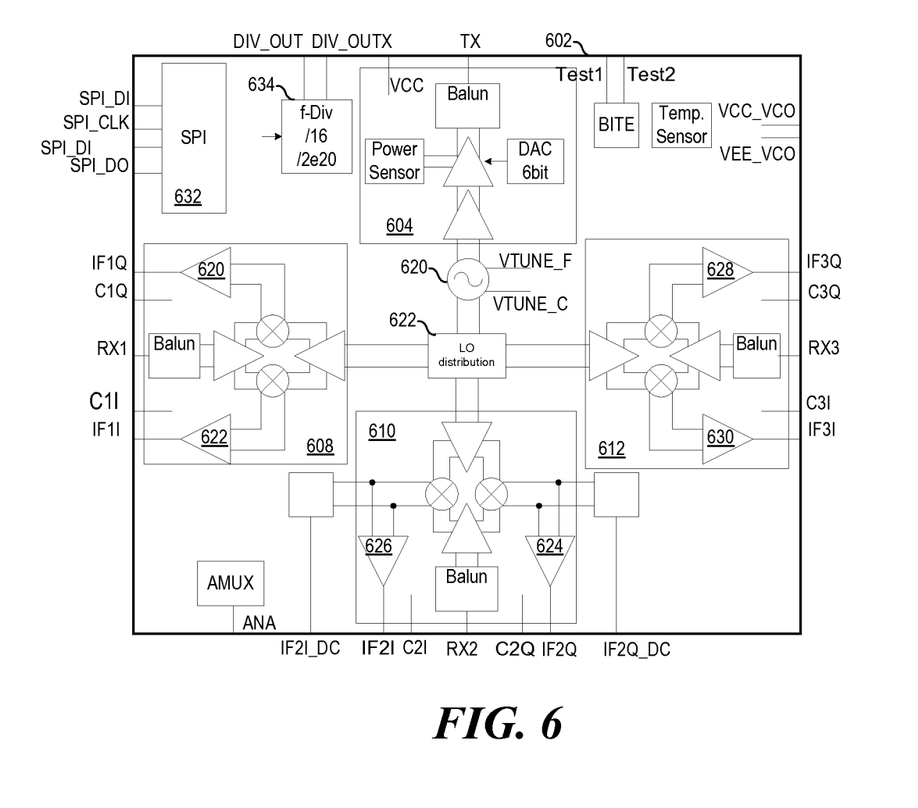
FIG. 6 illustrates an embodiment radar transceiver integrated circuit.

FIG. 6 illustrates an embodiment radar transceiver integrated circuit 602 that may be used, for example, in an automotive or industrial radar system. Radar transceiver integrated circuit 602 includes one transmit path 604 and three embodiment homodyne downconversion receive paths 608, 610 and 612 that receive LO signal from a common LO distribution network 622 that distributes output of RF oscillator 620. In an embodiment, homodyne downconversion receive paths 608, 610 and 612 include embodiment DC blocking circuits 620, 622, 624, 626, 628 and 630 that work in conjunction with external capacitors (not shown) that may be coupled to pins C1Q, C1I, C2Q, C2I, C3Q and C3I respectively. Alternatively, capacitors may be disposed directly on radar transceiver integrated circuit 602 itself without using external pins. DC blocking circuits 620, 622, 624, 626, 628 and 630 may also contain some variable gain functionality as described above. In some embodiments, radar transceiver integrated circuit 602 also includes various support circuitry such as frequency divider 634 and digital interface 632 that may be implemented using a serial peripheral interface (SPI) or other interface type.

Figure 7:
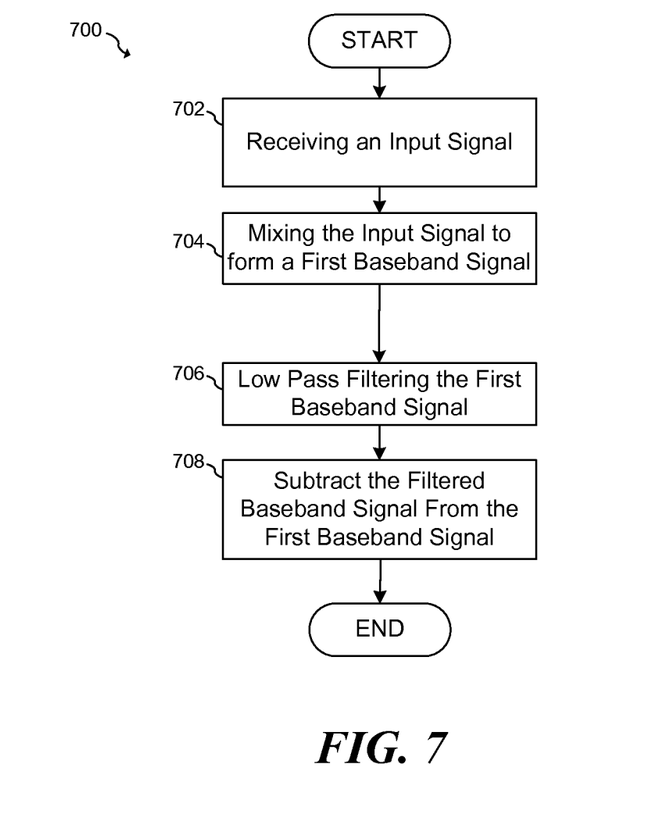
FIG. 7 illustrates a flowchart of an embodiment method.

FIG. 7 illustrates a flowchart of embodiment method 700. In step 702, an input signal is received, for example, from a wireless source such as an antenna or from a wireline source. Receiving the input signal may be further facilitated using receiver circuitry, such as a LNA. In step 704, the input signal is mixed with a LO signal to form a first baseband signal. In some embodiments, this mixing may be performed using a homodyne or single conversion mixer. Next, a DC component of the first baseband signal is removed by lowpass filtering the first baseband signal in step 706 and subtracting the filtered baseband signal from the first baseband signal in step 708.

In accordance with an embodiment, a circuit includes a mixer having a signal input port, a local oscillator input port and an output port, a lowpass filter circuit having an input coupled to the output port of the mixer and a terminal configured to be connected to a shunt capacitor, and a difference circuit having a first input coupled to the output port of the mixer, and a second input coupled to an output of the lowpass filter. The output of the difference circuit substantially rejects a DC signal component at the output port of the mixer. In some embodiments, the circuit further includes the shunt capacitor, such that the output of the difference circuit substantially rejects a DC signal component at the output port of the mixer. The mixer may be implemented as a homodyne mixer and/or as a quadrature mixer.

In an embodiment, the lowpass filter circuit includes a resistor and the difference circuit comprises an operational amplifier. For example, in once example, the lowpass filter includes a first resistor coupled between the output port of the mixer and the terminal, such that the terminal is coupled to a second input of the operational amplifier. The circuit may further include a second resistor coupled between the output port of the mixer and a first input of the operational amplifier, a third resistor coupled between an output of the operational amplifier and the first input of the operational amplifier, and a fourth resistor coupled between a reference node and the second input of the operational amplifier.

In some embodiments, the lowpass filter and the difference circuit are disposed on an integrated circuit; the terminal is implemented using a bonding pad disposed on the integrated circuit. In some embodiments, the circuit further includes the shunt capacitor external to the integrated circuit. The circuit may also include a low noise amplifier having an output coupled to an input of the mixer.

In accordance with a further embodiment, an integrated circuit includes a mixer and a DC blocking circuit coupled to an output of the mixer. The DC blocking circuit includes a terminal configured to be coupled to an off-chip shunt capacitor, a difference circuit comprising a first input coupled to the terminal and a second terminal coupled to an output of the mixer. In some embodiments, the difference circuit may include an operational amplifier.

The integrated circuit may further include a low noise amplifier having an output coupled to an input of the mixer and an input coupled to a receive terminal of the integrated circuit. Moreover, the integrated may further include a frequency generator having an output coupled to a local oscillator port of the mixer, and an amplifier having an input coupled to the frequency generator and an output coupled to a transmit terminal of the integrated circuit. Some embodiments include a first antenna coupled to the transmit terminal of the integrated circuit and a second antenna coupled to the receive terminal of the integrated circuit.

In accordance with a further embodiment, a radar system includes a low noise amplifier, a homodyne mixer coupled to an output of the low noise amplifier, and a DC blocking circuit coupled to an output of the homodyne mixer. The DC blocking circuit includes a lowpass filter circuit having an input coupled to an output port of the homodyne mixer, and a difference circuit having a first input coupled to the output port of the mixer and a second input coupled to an output of the lowpass filter. In some embodiments, the homodyne mixer is implemented using a quadrature mixer.

In an embodiment, the low noise amplifier, the homodyne mixer and the difference circuit are disposed on a first integrated circuit, and the lowpass filter includes a shunt capacitor that is disposed external to the first integrated circuit. In some embodiments, the radar system is a Frequency Modulated Continuous Wave (FMCW) radar system.

In accordance with a further embodiment, a method of operating a homodyne radio frequency (RF) system includes receiving an input signal using a low noise amplifier, mixing the input signal with a local oscillator (LO) signal using a mixer to form a first output signal, and removing a DC component of the first output signal. Removing includes lowpass filtering the first output signal to form a filtered output signal, and subtracting the filtered output signal from the first output signal to form a second output signal. In an embodiment, subtracting the filtered output signal includes using an operational amplifier, and lowpass filtering the first output signal includes using a capacitor coupled to an input of the operational amplifier. Receiving the input signal may include receiving a radar signal.

In some embodiments, the first output signal is a first baseband signal, the filtered output signal is a filtered baseband signal, and the second output signal is a second baseband signal. In a further embodiment, the first output signal is a first low IF signal, the filtered output signal is a filtered low IF signal, the second output signal is a second low IF signal Advantages of some embodiment systems include the ability to achieve a high level of integration by partitioning an RF downconverter and baseband circuitry on the same chip without the need for large DC blocking capacitors. A further advantage includes good matching of the electrical characteristics of multiple signal paths since more components may be included on the same chip. Another advantage of some systems that utilize embodiment DC blocking systems and methods includes a reduced number of interface pins, high reliability of the overall circuit, reduced circuit board area and increased cost effectiveness.

Further advantages include the ability to implement a DC blocking function with a minimum amount of additional package pins to realize a highpass filter with low cutoff frequency.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, it should be appreciated that the specific embodiments disclosed herein are just examples of systems and methods that utilize DC blocking techniques. Embodiments systems and methods may be applied, for example, to other system types besides radar systems. For example, embodiment DC blocking techniques may also be applied toward low-IF receivers, and other high frequency and low frequency circuits and systems that utilize DC blocking. Moreover, embodiment DC blocking techniques may also be applied in systems that use heterodyne mixers and other types of RF circuits.

What is claimed is:

1. A circuit comprising:
a mixer comprising a signal input port, a local oscillator input port and an output port, wherein the output port of the mixer comprises a current mode output;
a first current steering circuit and a second current steering circuit, wherein the first and second current steering circuit each comprises a first positive current source, a first negative current source, and an output, and for each of the current steering circuits:
the first positive current source is coupled in series with the first negative current source, wherein
the first positive current source is configured to provide a positive current based on a positive output of a mixer,
the first negative current source is configured to provide a negative current based on a negative output of the mixer, and
an output current at the output of each current steering circuit is a sum of the first positive current source and the first negative current source;
a lowpass filter circuit having an input coupled to the output of the second current steering circuit and a terminal configured to be connected to a shunt capacitor; and
a difference circuit having a first input coupled to the output of the first current steering circuit and a second input coupled to the output of the second current steering circuit and an output of the lowpass filter circuit, wherein an output of the difference circuit substantially rejects a DC signal component at the output port of the mixer.

2. The circuit of claim 1, further comprising the shunt capacitor.

3. The circuit of claim 1, wherein:
the lowpass filter circuit comprises a resistor coupled between a reference node and the second input of the difference circuit; and
the difference circuit comprises an operational amplifier.

4. The circuit of claim 3, wherein:
the output port of the mixer comprises a current mode output;
the terminal is connected to a first input of the operational amplifier;
the difference circuit comprises first resistor coupled between an output of the operational amplifier and the first input of the operational amplifier; and
the lowpass filter circuit comprises a second resistor coupled between a reference node and a second input of the operational amplifier.

5. The circuit of claim 1, wherein:
the mixer, the first current steering circuit, the second current steering circuit, the lowpass filter circuit and the difference circuit are disposed on an integrated circuit; and
the terminal comprises a bonding pad disposed on the integrated circuit.

6. The circuit of claim 5, further comprising the shunt capacitor, wherein the shunt capacitor is external to the integrated circuit.

7. The circuit of claim 1, further comprising a low noise amplifier having an output coupled to an input of the mixer.

8. The circuit of claim 1, wherein the mixer comprises a homodyne mixer.

9. An integrated circuit in a radar system comprising:
a mixer, wherein an output port of the mixer comprises a current mode output; and
a DC blocking circuit coupled to an output of the mixer, the DC blocking circuit comprising
a first current steering circuit and a second current steering circuit, wherein the first and the second current steering circuit each comprises a first positive current source and a first negative current source and an output, wherein a value of the first positive current source and the first negative current source are a function of an output of the mixer,
a terminal configured to be coupled to an off-chip shunt capacitor, and
a difference circuit comprising a first input coupled to the terminal and an output of the first current steering circuit and a second terminal coupled to an output of the first current steering circuit;
a low noise amplifier having an output coupled to an input of the mixer and an input coupled to a receive terminal of the integrated circuit;
a frequency generator having an output coupled to a local oscillator port of the mixer; and a power amplifier having an input coupled to the frequency generator and an output coupled to a transmit terminal of the integrated circuit.

10. The integrated circuit of claim 9, wherein the difference circuit comprises an operational amplifier.

11. The integrated circuit of claim 9, further comprising a low noise amplifier having an output coupled to an input of the mixer and an input coupled to a receive terminal of the integrated circuit.

12. The integrated circuit of claim 9, further comprising a first antenna coupled to the transmit terminal of the integrated circuit and a second antenna coupled to the receive terminal of the integrated circuit.

13. The integrated circuit of claim 9, wherein the mixer comprises a quadrature mixer.

14. The integrated circuit of claim 9, further comprising an in-phase DC blocking circuit and a quadrature DC blocking circuit, wherein an input of the in-phase DC blocking circuit is coupled to an in-phase output of the mixer and an input of the quadrature DC blocking circuit is coupled to a quadrature output of the mixer.

15. The integrated circuit of claim 14, further comprising a baseband circuitry configured to recover an in-phase baseband signal and a quadrature baseband signal disposed on the integrated circuit.

16. A radar system comprising:
a low noise amplifier;
a homodyne mixer coupled to an output of the low noise amplifier; and
a DC blocking circuit coupled to an output of the homodyne mixer, the DC blocking circuit comprising
a lowpass filter circuit having an input coupled to an output of a second current steering circuit, wherein the second current steering circuit is configured to generate an output current based on an output of the homodyne mixer, and
a difference circuit having a first input coupled to an output of a first current steering circuit, wherein the first current steering circuit is configured to generate an output current based on the output of the homodyne mixer.

17. The radar system of claim 16, wherein the homodyne mixer comprises a quadrature mixer.

18. The radar system of claim 16, wherein:
the low noise amplifier, the homodyne mixer and the difference circuit are disposed on a first integrated circuit; and
the lowpass filter circuit comprises a shunt capacitor that is disposed external to the first integrated circuit.

19. The radar system of claim 16, wherein the radar system comprises a Frequency Modulated Continuous Wave (FMCW) radar system.

20. The radar system of claim 16, further comprising:
a transmit circuit having an input coupled to an output of a RF Oscillator and an output coupled to a transmit terminal;
a first, a second and a third homodyne down conversion receive circuits, wherein the first, second and third homodyne down conversion receive circuit each comprises
the low noise amplifier,
the homodyne mixer, and
the DC blocking circuit; and
a local oscillator (LO) distribution circuit configured to provide an oscillator output to an input of each down conversion homodyne receive circuit.

* * * * *